United States Patent [19]

Richards, Jr.

[11] Patent Number: 4,580,285
[45] Date of Patent: Apr. 1, 1986

[54] SCANNING AM RADIO WITH DISCRIMINATOR-DRIVEN-SCAN-STOP-CIRCUIT

[75] Inventor: Oliver L. Richards, Jr., N. Grosvenor Dale, Conn.

[73] Assignee: Sprague Electric Company, North Adams, Mass.

[21] Appl. No.: 530,132

[22] Filed: Sep. 7, 1983

[51] Int. Cl.[4] ............................................. H03J 7/18
[52] U.S. Cl. ................... 455/161; 455/169; 455/200; 455/263; 455/337
[58] Field of Search ............... 455/161, 164, 169, 200, 455/245, 246, 165, 214, 263, 337

[56] References Cited

U.S. PATENT DOCUMENTS

| | | |
|---|---|---|
| 2,601,384 | 6/1952 | Goodrich . |
| 3,201,696 | 8/1965 | Sharp . |
| 3,628,046 | 12/1971 | Bilotti . |
| 3,714,580 | 1/1973 | Close . |
| 3,800,226 | 3/1974 | Close .................................. 455/214 |
| 3,967,203 | 6/1976 | Lucas et al. ........................ 455/263 |
| 4,053,838 | 10/1977 | Amaya ................................ 455/164 |
| 4,123,716 | 10/1978 | Borg .................................... 455/164 |
| 4,245,348 | 1/1981 | Imazeki .............................. 455/165 |
| 4,262,363 | 4/1981 | Wiechmann et al. ............... 455/161 |

FOREIGN PATENT DOCUMENTS 2100084 10/1982 United Kingdom ............... 455/161

OTHER PUBLICATIONS

Tanaka et al, New Digital Synthesizer LSI for FM/AM Receivers, IEEE Trans. on Consumer Electronics, vol. CE-27, No. 3, Aug. 1981, pp. 210-219.
Ichinose et al, One Chip AM/FM Digital Tuning System, IEEE Trans. on Consumer Electronics, vol. CE-26, Aug. 1980, pp. 282-288.

Primary Examiner—Jin F. Ng

[57] ABSTRACT

An integrated circuit AM radio receiver includes a scan-tuner comprised of a frequency synthesizer with micro-processor controller. The tuner stops scanning when an AGC derived signal increases beyond a predetermined level indicating a strong station and additionally when another signal falls below a predetermined level indicating that the radio is accurately tuned to the station frequency. The another signal is derived from an FM discriminator simultaneously using the same coil as is employed for tuning the last AM-IF stage.

3 Claims, 3 Drawing Figures

SCANNING AM RADIO WITH DISCRIMINATOR-DRIVEN-SCAN-STOP-CIRCUIT

BACKGROUND OF THE INVENTION

This invention relates to an AM radio receiver having a scan-tuning feature and more particularly to such a receiver including an FM discriminator followed by a "window" level detector for producing a scan stop signal only when a station is in tune.

A scan-tuning feature is known whereby, upon being initiated manually, the radio is automatically scan-tuned from one end of the broadcast band toward the other and stopping on a station of signal strength exceeding a predetermined satisfactory value. Since AM broadcast stations are allocated, their carrier frequencies, each in the middle of a narrow 10 KHz wide sub-band or channel, the scan-tuner of an AM receiver may step-tune the receiver in 10 KHz increments through the broadcast band.

Scan-tuning circuits are employed in automobile radios to ameliorate the problem of constant changes in station signal strength that requires frequent searching for a station giving high quality reception. The scanner typically monitors the (automatic gain control) AGC voltage, which is a measure of radio signal strength, and stops in the middle of the 10 KHz band for which there is being received a signal of acceptable strength. In other words, it should stop only when the AGC signal is greater than a predetermined value corresponding to an acceptably strong radio signal. Such a scanner is described in the paper entitled One Chip AM/FM Digital Tuning System by Ichinose et al, IEEE Transactions on Consumer Electronics, Vol. CE - 26 Aug. 1980.

However, as the scanner approaches a very strong station some signal is detectable well before reaching the station carrier frequency. Thus, such automatic scan-tuning systems tend to stop a whole 10 KHz increment early before reaching the frequency of a very strong station. The initial result is highly distorted disagreeable sound.

It is also known to combine with such automatic scan-tuning radios, an automatic frequency control (AFC) circuit that is actuated after the scanning is stopped. Such AFC systems, however, cannot span the 10 KHz range necessary to change the tuning to the next allocated station frequency.

It is therefore an object of this invention to overcome the above-noted short comings of the prior art.

It is a further object of this invention to provide an AM radio receiver having an automatic scan-tuning system that does not stop on a signal unless that signal is of adequate strength and is also accurately tuned in.

SUMMARY OF THE INVENTION

A scanning superheterodyne AM radio receiver has electrically tuned RF and local oscillator circuits, a mixer, an analog-gain-mode IF amplifier with a tuned output coil, and an AM detector with an input connected to the IF coil. The receiver also includes an automatic-scanning circuit means for scan tuning the RF and local oscillator circuits and means for stopping scanning at a frequency of a received transmitting station for which the received signal strength is greater than a predetermined range of amplitudes.

According to this invention an FM detector has an input that is also connected to the IF coil. A window-threshold detector means is connected to the output of the FM detector for stopping scanning only when the signal at the output of the FM detector is within a range corresponding to a well tuned-in station, so that scanning is stopped only when both conditions prevail, namely a strong radio signal is being received and the radio signal is accurately tuned in.

This invention is especially effective when the above-noted means for stopping scanning (if signal strength is great enough) includes an AGC restorer circuit means for eliminating from the AGC signal nonlinearities and especially time delays relative to the strength of the incoming radio signal. This makes possible to scan faster and stop with greater certainty and precision on radio signals of medium strength.

Such advantages of the invention may be more fully exploited when the FM detector employed is of the direct-coupled double-balanced discriminator type which is inherently fast itself.

DESCRIPTION OF THE PREFERRED EMBODIMENTS

Figure 1:
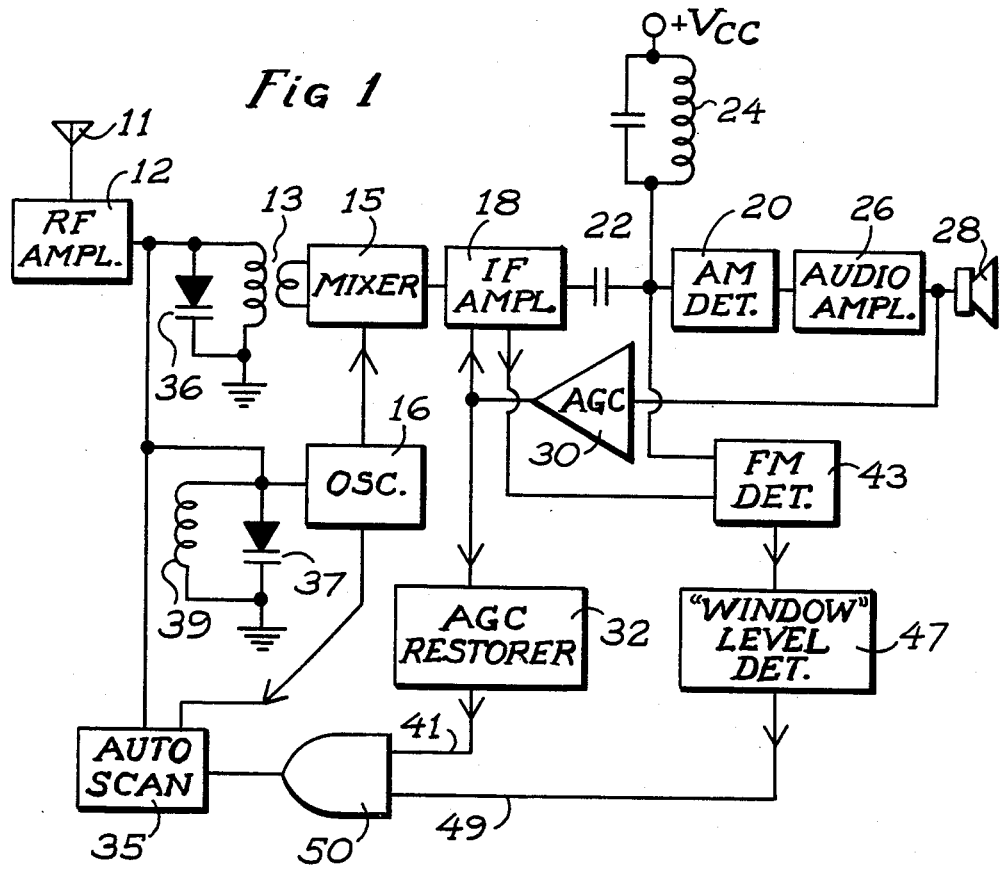
FIG. 1 shows a block diagram of a scanning AM radio of this invention.

Referring to FIG. 1, a transmitted radio signal is received on antenna 11 and applied to radio frequency amplifier 12 where it is amplified and applied via a tuned transformer 13 to a mixer circuit 15. In the mixer circuit 15 the received radio signal is heterodyned with the signal from a local oscillator 16 to produce an IF signal. The IF signal is amplified in an IF amplifier 18. It is subsequently applied to the AM detector via a tuned circuit including a DC blocking and tuning capacitor 22 and a coil 24. The demodulated signal from the AM detector 20 is then amplified in audio amplifier 26 that drives speaker 28. The audio amplifier 26 is a DC coupled type having a pass band from DC up through the audio frequencies. An automatic gain control (AGC) circuit 30 uses the DC component at the output of the audio amplifier 26. That DC component is proportional to the strength of the IF carrier signal.

The AGC circuit 30 provides a signal to the IF amplifier 18 that adjusts the gain of the latter so that the amplitude of the audio signal is held essentially constant. At the same time, the AGC circuit provides a signal to the AGC restorer circuit 32. Restorer circuit 32 compensates for the highly nonlinear relationship between the output signal from the AC circuit 30 and the strength of the incoming radio signal at the antenna 11.

Thus a signal is generated in the AGC restorer 32 that has an amplitude which is essentially proportional to the signal strength of the incoming radio signal. The restorer 32 also includes a threshold detector that establishes the predetermined radio signal strength at which the restorer output changes to another value.

An automatic scanning circuit 35 provides a control voltage across the varacter diode 36. Diode 36 forms a tuning tank circuit with transformer 13, scanning circuit 35 also provides a control voltage across the varacter diode 37 which forms a tuning tank circuit with coil 39.

Thus the capacitance of varacter 36 selects the frequency of the incoming RF signal to be received while the varacter 37 simultaneously determines the appropriate frequency of the local oscillator 16. The automatic scan circuit 35 is programmed to cause this superheterodyne radio to scan the AM radio band and stop at a radio station providing a received signal strength greater than a predetermined satisfactory level. That signal strength information is provided to the scan circuit 35 by the AGC restorer 32.

A radio receiver with such an automatic scan circuit 35, need not employ an AGC restorer but may get its radio signal strength information directly from the AGC circuit (e.g. 30). The AGC restorer circuit 32 is preferred however to provide a more reliable "stop signal" at one input 41 of the AND circuit 50. The AGC restorer circuit 32 is described in detail in my pending U.S. patent application entitled Signal Strength Detector in AM Radio Ser. No. 530,132, filed concurrently herewith on Sept. 7, 1983, now U.S. Pat. No. 4,538,300, and incorporated by reference herein.

Figure 2:
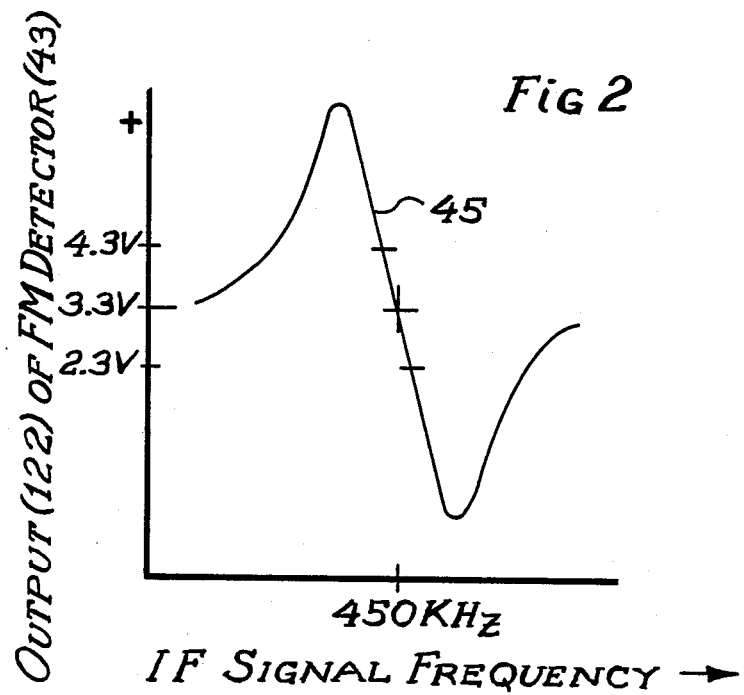
FIG. 2 shows the S-curve plot of output voltage versus signal frequency of an FM detector employed in the radio illustrated in FIG. 1.
Figure 3:
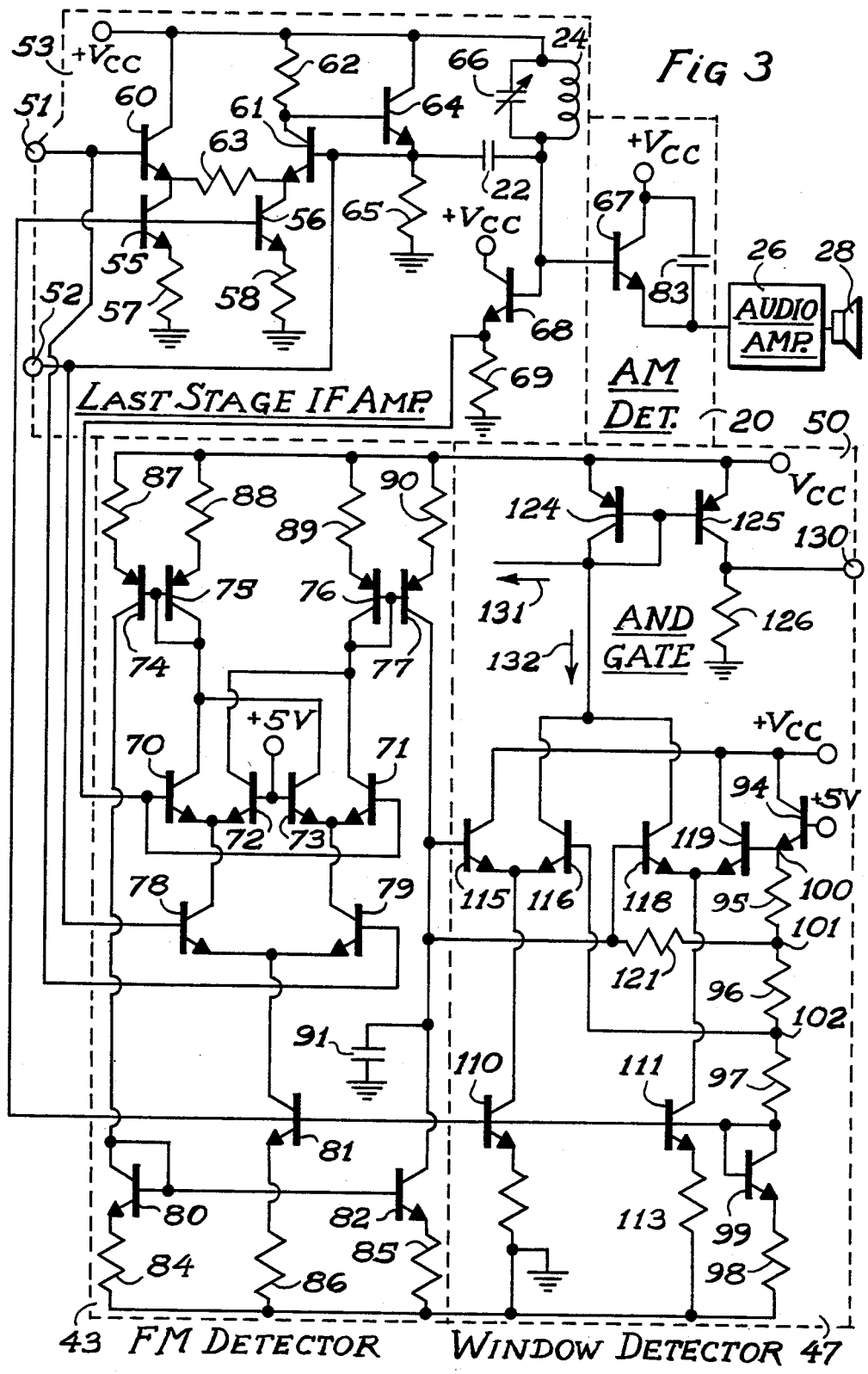
FIG. 3 shows a circuit diagram of a portion of the AM radio illustrated in FIG. 1.

The AM radio of FIG. 1 includes an FM detector 43 that produces an output signal that is proportional to the frequency difference between the frequency to which coil 24 is tuned and the carrier frequency of the IF signal in the IF amplifier. The output of a conventional discriminator detector employed as the FM detector 43 of FIG. 1, produces an output signal whose amplitude is plotted as curve 45 in FIG. 2 against the frequency of the radio signal in the IF amplifier 18. The output of the level detector 47 is connected to the other input line 49 of the AND gate 50. Thus, the AND gate 50 provides a stop signal to the auto scan circuit 35 to stop the scanning at a station frequency only when both the signal strength is satisfactorily high and the radio is properly tuned to the carrier frequency of the station. A further description of this novel portion of the radio of FIG. 1 is provided below with reference to the circuit shown in FIG. 3.

An amplitude modulated (AM) intermediate frequency (IF) signal will appear at the input conductors 51 and 52 of the last stage 53 of the IF amplifier. If stage 53 is a fixed-gain differential amplifier including emitter-current-source transistors 55 and 56 and resistors 57 and 58. IF stage 53 also includes the differential-amplifier transistors 60 and 61, collector load resistor 62, gain-degenerating resistor 63, emitter follower transistor 64 and emitter resistor 65. Capacitors 66 and 22 and coil 24 constitute a fixedly tuned circuit that is considered to be a part of the last IF stage 53. Adjustment of the tuning at manufacture can be effected by adjusting trimmer capacitor 66. The AM detector 20, comprised of transistor 67, is for demodulating the AM-IF signal developed across coil 24.

The base of transistor 68 is also connected to coil 24 and the IF signal across emitter resistor 69 is coupled to one input of the FM quad-multiplier detector 43 which includes transistors 70, 71, 72, 73, 74, 75, 76, 77, 78, 79, 80, 81 and 82. The other FM detector input is connected to the input conductors 51 and 52 of the third IF stage 53.

Briefly this FM detector works as follows. These first and second input IF signals to FM detector 43 are shifted in phase relative to each other by the capacitor 22, by an amount that is proportional to the frequency difference between the IF signal and the resonant frequency of the tuned circuit. A tank circuit comprised of coil 24 and capacitor 66 are essentially paralleled by the coupling capacitor 22 since the emitter follower of transistor 64 has a low output impedance. This tuned circuit has a fixed resonant frequency of about 450 KHz. The gated detector or discriminator circuit 43, acting as a phase comparator translates the phase difference between its two inputs into a voltage amplitude at its single ended output (at the collectors of transistors 77 and 82). This direct-coupled double-balanced discriminator is more fully described by A. Bilotti in his U.S. Pat. No. 3,628,046, issued Dec. 14, 1971 and assigned to the same assignee as is the present invention.

Thus the output voltage from the FM detector 43 is a direct measure of the degree to which the radio front-end is tuned to the incoming radio signal. The FM detector output voltage is connected to the input of the window level detector 47. In that window detector 47, the series connected transistor 94, resistors 95, 96, 97 and 98, and diode-connected transistor 99 form a voltage divider. A regulated +5 volts is applied to the base of transistor 94. The voltages at nodes 100, 101 and 102 are about 4.3 volts, 3.3 volts and 2.3 volts, respectively. The regulated 5 volts is derived on-board the integrated circuit chip by a regulator circuit obtaining its energy from the Vcc supply. Vcc is nominally 12 volts.

Transistors 110 and 111, along with resistors 112 and 113, form fixed current sources at the emitters of the pairs of gating transistors 115–116 and 118–119, respectively. The high impedance output of the FM detector 43 is biased at the voltage of node 101 (i.e. 3.3 volts) through resistor 121 which serves as the FM detector load. Now the output current 123 of the level detector 47 is the sum of the collector currents of transistors 116 and 118. This current 123 is only zero when the FM detector output voltage at conductor 122 lies between the voltages of nodes 100 and 102 (i.e. 2.3 to 4.3 volts corresponding to $V_A$ and $V_B$ in the curve 45 of FIG. 2). Note that the output voltage at 122 is 3.3 volts when the IF signal frequency is the same as the resonant frequency of the tuned circuit, coil 24 - capacitors 22 and 66, and that condition corresponds to perfect front-end tuning.

This AM radio has been built and operated. The portion of the circuit including the mixer 15, IF amplifier 18, AM detector 20, audio amplifier 26, AGC circuit 30, AGC restorer 32, FM detector 43 and "window" level detector 47 are embodied in an integrated circuit chip with the exception that capacitors 22, 66 and 91 as well as coil 24 are discrete components external to the integrated circuit. The transistors are thus standard integrated circuit types each having a standard emitter area of 20×20 microns. In the Table below are given the values of others of the components.

TABLE

| Resistors (ohms) | | Resistors (ohms) | |
|---|---|---|---|
| 57 | 1K | 95 | 1K |
| 58 | 1K | 96 | 1K |
| 62 | 4K | 97 | 1.35K |
| 63 | 1.4K | 98 | 250 |
| 65 | 1K | 112 | 500 |
| | | 113 | 500 |
| 69 | 10K | 121 | 53.9K |
| 84 | 500 | 126 | 10K |
| 85 | 500 | | |
| 86 | 3.1K | Capacitors | |
| 87 | 500 | 22 | 12 pf |
| 88 | 500 | 66 | 100 pf |
| 89 | 500 | 83 | 7 pf |

TABLE-continued

| Resistors (ohms) | Resistors (ohms) |
| --- | --- |
| 90  500 | 91  0.0033 μf |

The savings realized in this invention by employing only one coil 24 for both the IF tuning as well as a discriminator phase delay inductor is especially significant when, as here, the radio is substantially in silicon integrated form.

The output current 123 from the window detector 47 is one component of input current in the AND-gate. Two current-mirror connected transistors 124 and 125, and resistor 126 that serves as an output load at the collector of transistor 125 make up the AND-gate. An output current 123 causes about +5 volts to appear at output terminal 130. This is the circuit point at which the scan circuit receives a scan stop signal (zero voltage). Another gate input current 131, the output from a restorer circuit (not shown in FIG. 3), would by itself also cause about 5 volts to appear at terminal 130 when the signal is weak. Thus in this gate circuit, only when currents 123 and 131 are both absent will the voltage at terminal 130 be zero and the scan circuit (35, FIG. 1) signaled to stop.

What is claimed is:

1. In a scanning superheterodyne AM radio having an RF stage including an electrically tunable load circuit, and electrically tunable local oscillator circuit, a mixer for heterodyning signals from said RF stage and said local oscillator, an analog-gain-mode IF amplifier connected to said mixer, an IF output coil connected to the output of said IF amplifier and tuned to an IF frequency, an AM detector having an imput electrically connected to said IF coil, an audio amplifier connected to said AM detector, an automatic-scanning circuit to scan-tune said electrically tunable load and oscillator, the improvement comprising:

a double-balanced FM discriminator circuit having a first input connected to said IF coil and a second input connected to said IF amplifier for generating a control signal of amplitude that is a function of the difference between the carrier frequency of the IF signal in said If amplifier and the frequency to which said coil is tuned, means for determining the signal strength of an AM signal received at the RF stage to provide a signal strength indicating signal, and means for stopping the scan-tuning at a frequency of a received transmitting-station only when the signal strength indicating signal is greater than a predetermined range of amplitudes and when said control signal from said FM discriminator circuit is within a predetermined range of low values, so that scanning is stopped only when both conditions prevail, namely a strong signal is being received and the radio is accurately tuned to it.

2. The AM radio of claim 1 wherein said tuned frenquency of said IF coil is about 450 KHz.

3. A scanning superheterodyne AM radio comprising:

an RF stage including an electrically tunable load circuit; an electrically tunable local oscillator circuit; a mixer for heterodyning the signals from said RF stage and said local oscillator; and analog-gain-mode If amplifier connected to said mixer; a tuned coil at the output of said If amplifier; an AM detector having an input electrically connected to said IF coil; an audio amplifier connected to said AM detector; a scanning circuit to scan-tune said electrically tunable load and oscillator;

an AGC circuit means for automatically altering the gain of said If amplifier to hold the audio output signal at a substantially constant level for a wide range of signal strengths of the incoming IF signal from said mixer;

a restorer circuit means having a controllable gain and having an input connected to the output of said IF amplifier therein and for changing said restorer gain inversely as the gain of said IF amplifier to produce a monitoring signal that is proportional to the strength of an AM radio broadcast signal to which the receiver is tuned;

a double-balanced FM discriminator circuit having an input connected to said IF coil for generating a control signal of amplitude that is a function of the difference between the carrier frequency of the AM radio signal in said IF amplifier and the frequency to which said IF coil is tuned;

a scan stop means connected to said restorer circuit means and to said FM discriminator circuit for producing a scan stop signal at said scanning circuit when said control signal is within a perdetermined amplitude range and when said monitoring signal simultaneously exceeds a predetermined value.

* * * * *